US 12,407,546 B2

(12) United States Patent
Chuang et al.

(10) Patent No.: US 12,407,546 B2
(45) Date of Patent: Sep. 2, 2025

(54) DECISION-FEEDBACK EQUALIZER USING FEEDBACK FILTER WITH CONTROLLABLE DELAY CIRCUIT AND ASSOCIATED METHOD

(71) Applicant: MEDIATEK INC., Hsin-Chu (TW)

(72) Inventors: Chih-Lun Chuang, Hsinchu (TW); Wen-Hsuan Hsieh, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 72 days.

(21) Appl. No.: 18/118,160

(22) Filed: Mar. 7, 2023

(65) Prior Publication Data
US 2023/0308316 A1   Sep. 28, 2023

Related U.S. Application Data

(60) Provisional application No. 63/324,213, filed on Mar. 28, 2022.

(51) Int. Cl.
*H04L 25/03*       (2006.01)
*H03K 5/131*       (2014.01)
*H03K 5/14*        (2014.01)
*H03K 5/00*        (2006.01)

(52) U.S. Cl.
CPC ........ *H04L 25/03057* (2013.01); *H03K 5/131* (2013.01); *H03K 5/14* (2013.01); *H03K 2005/00013* (2013.01)

(58) Field of Classification Search
CPC ......... H04L 25/03057; H04L 25/03121; H04L 25/03146; H03K 5/131; H03K 5/14; H03K 2005/00013
See application file for complete search history.

(56) References Cited

U.S. PATENT DOCUMENTS

| 9,094,239 B1* | 7/2015 | Luo ................... H04L 25/03057 |
| 2010/0104000 A1* | 4/2010 | Pozzoni ............. H04L 25/0307 |
| | | 375/233 |
| 2012/0025800 A1* | 2/2012 | Dettloff .............. H04L 25/0272 |
| | | 323/299 |
| 2013/0021074 A1* | 1/2013 | Finn .................. H04L 25/03885 |
| | | 327/162 |
| 2018/0102924 A1 | 4/2018 | Gunn |
| 2021/0083706 A1 | 3/2021 | Iwai |
| 2021/0152165 A1 | 5/2021 | Manian |

(Continued)

OTHER PUBLICATIONS

Soumya Chandramouli et al., A 10-Gb/sec Unclocked Current-Mode Logic (CML) Analog Decision-Feedback Equalizer (ADFE) in 0.18-μm CMOS, 2007, pp. 512-515, IEEE, XP031202266, 2007.

(Continued)

*Primary Examiner* — David S Huang
(74) *Attorney, Agent, or Firm* — Winston Hsu

(57) ABSTRACT

A decision-feedback equalizer (DFE) includes a combining circuit and a feedback filter. The combining circuit combines an input signal and at least one feedback signal to generate an equalized signal. The feedback filter generates the at least one feedback signal according to the equalized signal, and includes a controllable delay circuit. The controllable delay circuit receives an output signal that is derived from the equalized signal, and applies at least one delay amount to generate at least one delay signal, wherein the at least one feedback signal is derived from the at least one delay signal.

12 Claims, 10 Drawing Sheets

(56) References Cited

U.S. PATENT DOCUMENTS

2021/0409014 A1* 12/2021 Manian .................. H03L 7/087
2023/0006866 A1* 1/2023 Hollis .............. H04L 25/03057

OTHER PUBLICATIONS

Kim et al., A 1.1-V 10-nm class 6.4-Gb/s/pin 16-GB DDR5 SDRAM With a Phase Rotator-ILO DLL, High-Speed SerDes, and DFE/FFE Equalization Scheme for Rx/Tx, IEEE Journal of Solid-State Circuits, vol. 55, No. 1, pp. 167-177, Jan. 2020.

* cited by examiner

DECISION-FEEDBACK EQUALIZER USING FEEDBACK FILTER WITH CONTROLLABLE DELAY CIRCUIT AND ASSOCIATED METHOD

CROSS REFERENCE TO RELATED APPLICATIONS

This application claims the benefit of U.S. Provisional Application No. 63/324,213, filed on Mar. 28, 2022. The content of the application is incorporated herein by reference.

BACKGROUND

The present invention relates to data communications, and more particularly, to a decision-feedback equalizer (DFE) using a feedback filter with a controllable delay circuit and an associated method.

In high-speed data communication systems, filtering and equalization schemes are commonly utilized. Detection of a received signal in a data communication system is challenging due to several factors such as noise, cross-talk, and inter-symbol interference (ISI). A typical decision-feedback equalizer (DFE) at the receiver side can remove the post-cursor ISI by using one or more past data bits. The typical DFE needs clock and data recovery (CDR) to place the clock edge at the data center location to achieve optimum DFE performance. If a clock edge location at which a slicer performs a data slicing operation upon a data signal is not located at the data center, the DFE performance will be degraded. Furthermore, a receiver (RX) eye scan provides a mechanism to measure and visualize the RX eye margin after the equalizer. However, the RX eye scan needs to change the clock edge location to find the optimum data center location. Since the DFE performance is dependent on the clock edge location, it is hard for the typical DFE to do the RX eye scan and keep the optimum DFE performance. Thus, there is a need for innovative clock-less DFE architecture which can keep best performance without considering the clock edge position.

SUMMARY

One of the objectives of the claimed invention is to provide a decision-feedback equalizer (DFE) using a feedback filter with a controllable delay circuit and an associated method.

According to a first aspect of the present invention, an exemplary decision-feedback equalizer (DFE) is disclosed. The exemplary DFE includes a combining circuit and a feedback filter. The combining circuit is arranged to combine an input signal and at least one feedback signal to generate an equalized signal. The feedback filter is arranged to generate the at least one feedback signal according to the equalized signal. The feedback filter includes a controllable delay circuit. The controllable delay circuit is arranged to receive an output signal that is derived from the equalized signal, and apply at least one delay amount to generate at least one delay signal, wherein the at least one feedback signal is derived from the at least one delay signal.

According to a second aspect of the present invention, an exemplary decision-feedback equalization method is disclosed. The exemplary decision-feedback equalization method includes: combining an input signal and at least one feedback signal to generate an equalized signal; and generating the at least one feedback signal according to the equalized signal, including: in response to receiving an output signal that is derived from the equalized signal, applying, by a controllable delay circuit, at least one delay amount to generate at least one delay signal, wherein the at least one feedback signal is derived from the at least one delay signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
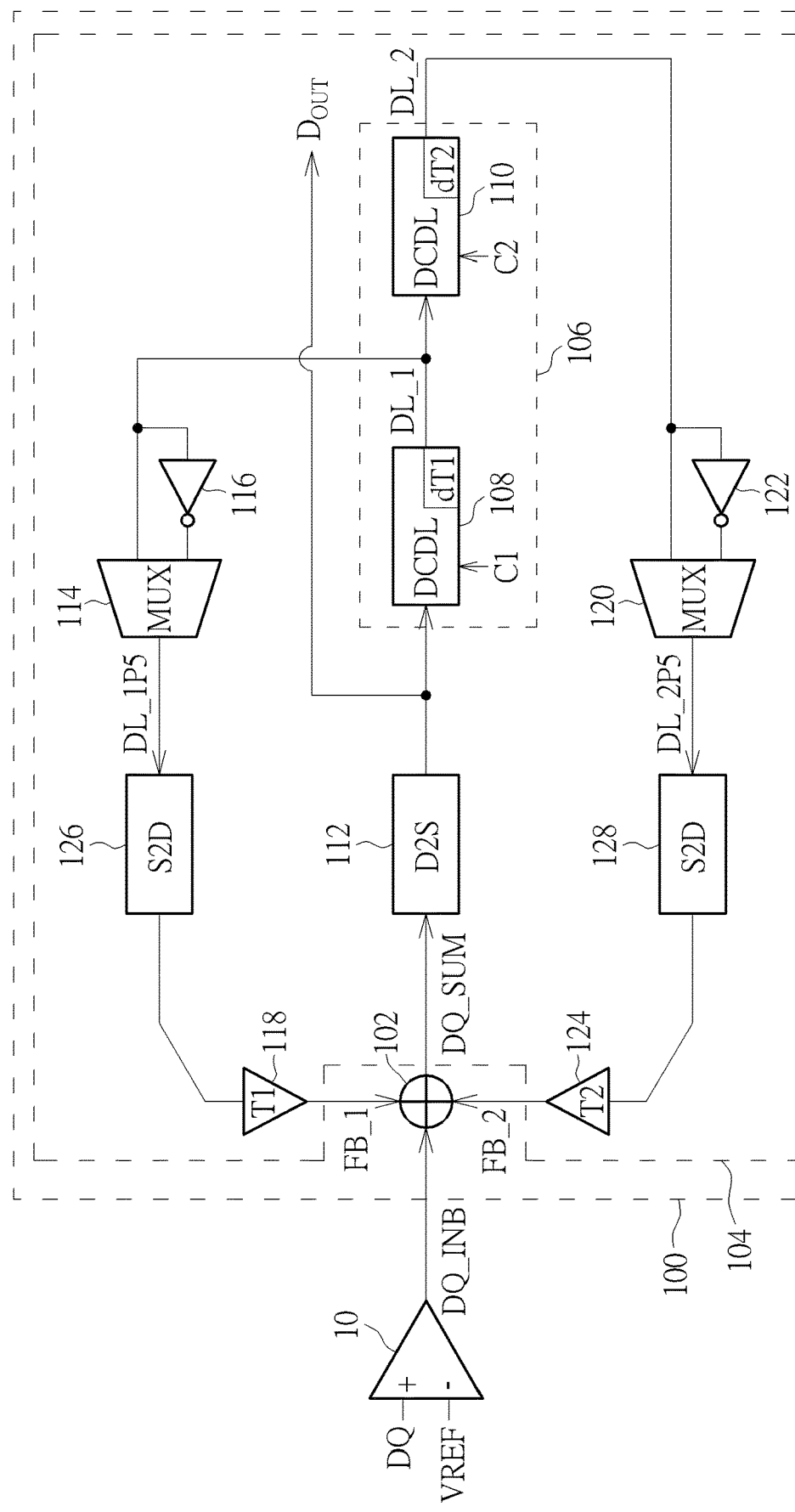
FIG. 1 is a diagram illustrating a first clock-less decision-feedback equalizer according to an embodiment of the present invention.

FIG. 1 is a diagram illustrating a first clock-less decision-feedback equalizer (DFE) according to an embodiment of the present invention. The clock-less DFE 100 may be a part of a receiver in a data communication system. For example, the data communication system may be any source-synchronous system such as a double data rate (DDR) memory system. The clock-less DFE 100 is arranged to equalize an input signal DQ_INB received from a preceding stage (e.g., receiver analog front-end circuit 10) to generate and output an output signal $D_{OUT}$ to a following stage (e.g., one or more slicers, not shown in FIG. 1). The receiver analog front-end (RX AFE) circuit 10 compares a data signal DQ with a reference voltage VREF to generate the input signal DQ_INB. For example, the data signal DQ is provided by a transmitter of a source-synchronous system (e.g., DDR memory system). The clock-less DFE 100 includes a combining circuit 102 and a feedback filter 104. The clock-less DFE 100 may employ n-tap (n≥2) DFE architecture. For brevity and simplicity, the clock-less DFE 100 is illustrated as a 2-tap DFE. Hence, the combining circuit 102 acts as a summer, and is arranged to combine the input signal DQ_INB and two feedback signals FB_1 and FB_2 to generate an equalized signal DQ_SUM. The feedback filter 104 is arranged to generate the feedback signals FB_1 and FB_2 according to the equalized signal DQ_SUM. If the channel causes post-cursors, the feedback signals FB_1 and FB_2 are intended to act as negative post-cursors for eliminating the post-cursors. Specifically, the clock-less DFE 100 is capable of negating the effects of post-cursors through the feedback filter 104.

In this embodiment, the equalized signal DQ_SUM output from the combining circuit 102 is directly fed into the feedback filter 104 without being processed by any clock-driven slicers (i.e., clock-driven decision circuits), such that the clock-free DFE 100 does not suffer from DFE performance degradation encountered by the typical DFE (which needs to place the clock edge at the data center location for achieving optimum DFE performance). Since the clock-free DFE 100 does not need a clock to do data sampling, the clock-free DFE 100 can do RX eye scan in the absence of DFE performance degradation caused by the clock position change.

In this embodiment, the feedback signals FB_1 and FB_2 are generated through the use of a controllable delay circuit 106. The controllable delay circuit 106 is arranged to receive the output signal $D_{OUT}$ and apply a plurality of delay amounts to generate a plurality of delay signals DL_1 and DL_2, wherein each delay amount is adjustable, the feedback signal FB_1 is derived from the delay signal DL_1, and the feedback signal FB_2 is derived from the delay signal DL_2. As shown in FIG. 1, the controllable delay circuit 106 may be implementing by a plurality of digitally controlled delay lines 108 and 110 connected in series. The digitally controlled delay line (DCDL) 108 is arranged to apply a delay amount dT1 to the output signal $D_{OUT}$, for generating the delay signal DL_1 from which the feedback signal FB_1 is derived. The DCDL 110 is arranged to apply a delay amount dT2 to the delay signal DL_1 (which is equivalent to applying a delay amount dT1+dT2 to the output signal $D_{OUT}$), for generating the delay signal DL_2 from which the feedback signal FB_2 is derived. Hence, an operation of the controllable delay circuit 106 is equivalent to applying one delay amount TD=dT1 to the output signal $D_{OUT}$ for generating the delay signal DL_1 and applying another delay amount TD=dT1+dT2 to the output signal $D_{OUT}$ for generating the delay signal DL_2.

In a case where the input signal DQ_INB is a differential signal, the feedback filter 104 further includes a differential to single-ended converter (labeled by "D2S") 112 for converting the equalized signal DQ_SUM into a single-ended signal that acts as the output signal $D_{OUT}$. In another case where the input signal DQ_INB is a single-ended signal, the feedback filter 104 may be modified to omit the differential to single-ended converter 112, such that the equalized signal DQ_SUM directly acts as the output signal $D_{OUT}$. To put it simply, the output signal $D_{OUT}$ is derived from the equalized signal DQ_SUM, and is used to generate the feedback signals FB_1 and FB_2 for post-cursor ISI cancellation.

The delay signal DL_1 is fed back to the combining circuit 102 through a multiplexer (MUX) 114 and a multiplier 118, or is fed back to the combining circuit 102 through an inverter 116, the multiplexer 114 and the multiplier 118. Specifically, the multiplexer 114 may select the delay signal DL_1 as its multiplexer output signal DL_1P5 (i.e., DL_1P5=DL_1) or select an inverse version of the delay signal DL_1 as its multiplexer output signal DL_1P5 (i.e., DL_1P5=$\overline{DL\_1}$), depending upon actual equalization requirements for the channel.

The delay signal DL_2 is fed back to the combining circuit 102 through a multiplexer (MUX) 120 and a multiplier 124, or is fed back to the combining circuit 102 through an inverter 122, the multiplexer 120 and the multiplier 124. Specifically, the multiplexer 120 may select the delay signal DL_2 as its multiplexer output signal DL_2P5 (i.e., DL_2P5=DL_2) or select an inverse version of the delay signal DL_2 as the multiplexer output signal DL_2P5 (i.e., DL_2P5=$\overline{DL\_2}$), depending upon actual equalization requirements for the channel.

In a case where the input signal DQ_INB is a differential signal, the feedback filter 104 further includes one single-ended to differential converter (labeled by "S2D") 126 for converting the multiplexer output signal DL_1P5 at one feedback path into a differential form, and another single-ended to differential converter (labeled by "S2D") 128 for converting the multiplexer output signal DL_2P5 at another feedback path into a differential form. In another case where the input signal DQ_INB is a single-ended signal, the feedback filter 104 may be modified to omit both of the single-ended to differential converters 126 and 128.

The multiplier 118 is arranged to multiply the multiplexer output signal DL_1P5 by a tap coefficient T1, for generating and outputting the feedback signal FB_1 to the combining circuit 102, that is, FB1=T1×DL_1_P5, where a value of the tap coefficient T1 depends on the effect of a post-cursor to be negated. The multiplier 124 is arranged to multiply the multiplexer output signal DL_2P5 by a tap coefficient T2, for generating and outputting the feedback signal FB_2 to the combining circuit 102, that is, FB2=T2×DL_2P5, where a value of the tap coefficient T2 depends on the effect of a post-cursor to be negated.

In one exemplary implementation, the clock-less DFE 100 may be configured to equalize the input signal DQ_INB for eye height improvement. That is, with proper settings of tap coefficients T1 and T2, post-cursor ISI that affects the eye height of an eye diagram can be cancelled by the clock-less DFE 100. In another exemplary implementation, the clock-less DFE 100 may be configured to equalize the input signal DQ_INB for eye width improvement. That is, with proper settings of tap coefficients T1 and T2, post-cursor ISI that affects the eye width of an eye diagram can be cancelled by the clock-less DFE 100. To put it simply, settings of tap coefficients T1 and T2 used by the clock-less DFE 100 can be adjusted, depending upon actual design considerations.

Figure 2:
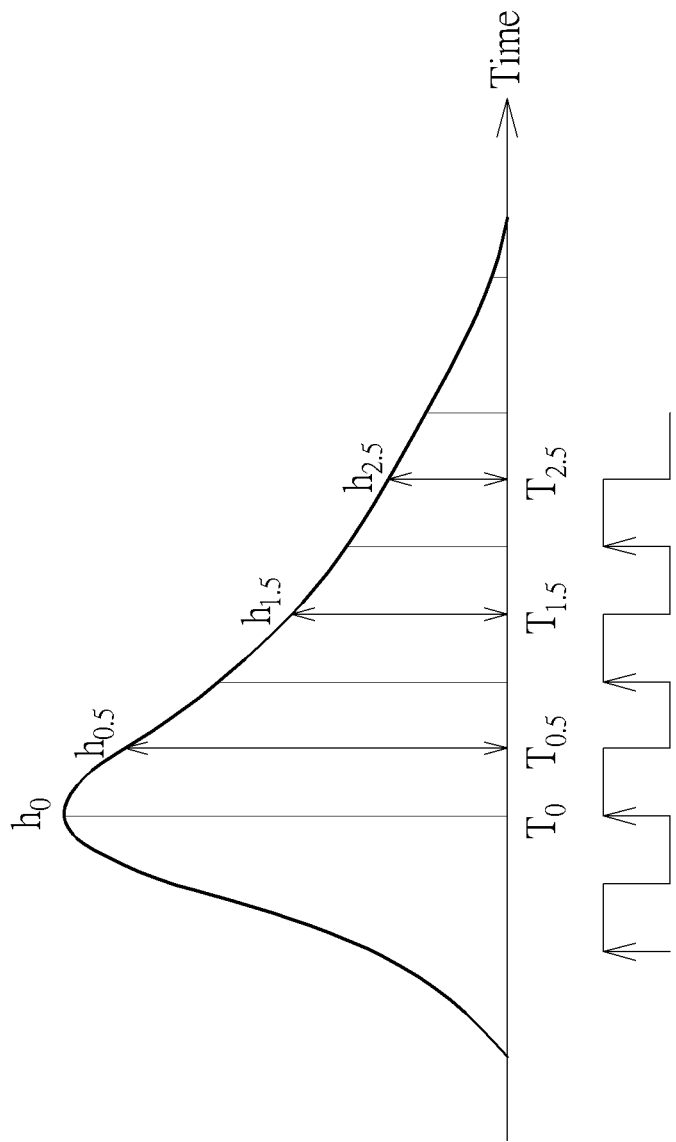
FIG. 2 is a diagram illustrating a pulse response of a channel according to an embodiment of the present invention.
Figure 3:
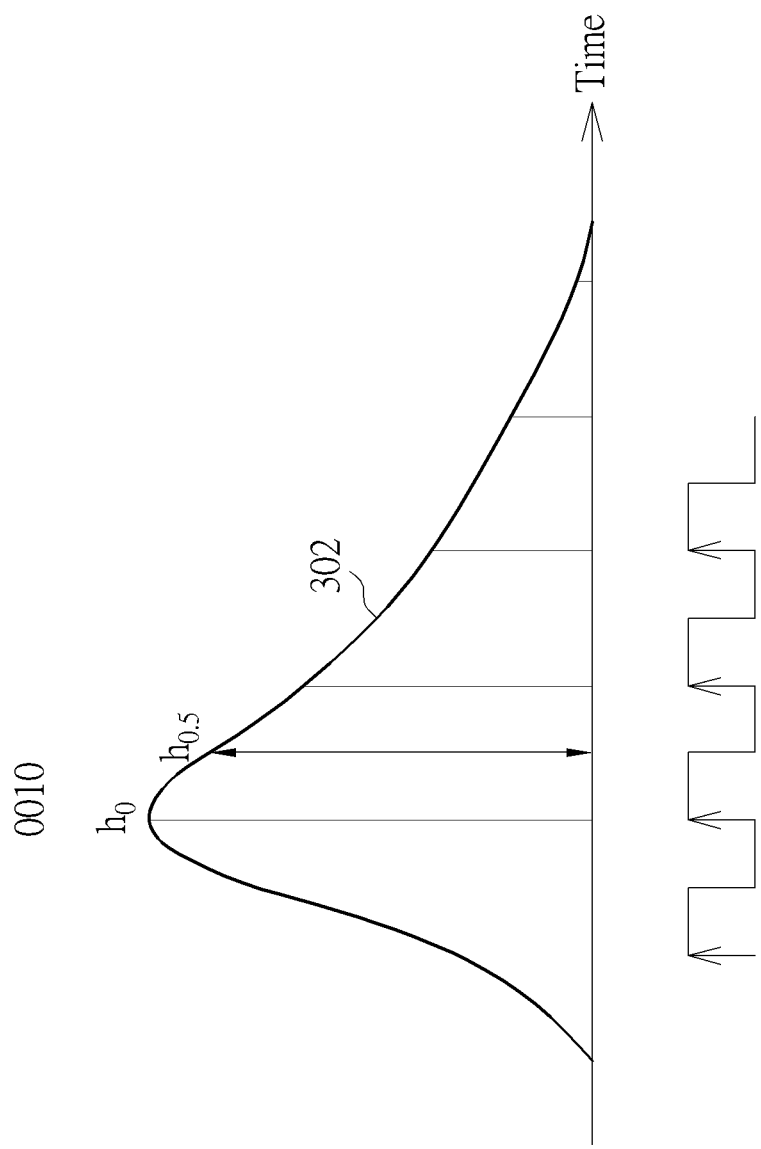
FIG. 3 is a diagram illustrating a waveform resulting from transmitting a pattern "0010" over the channel with the pulse response shown in FIG. 2.
Figure 4:
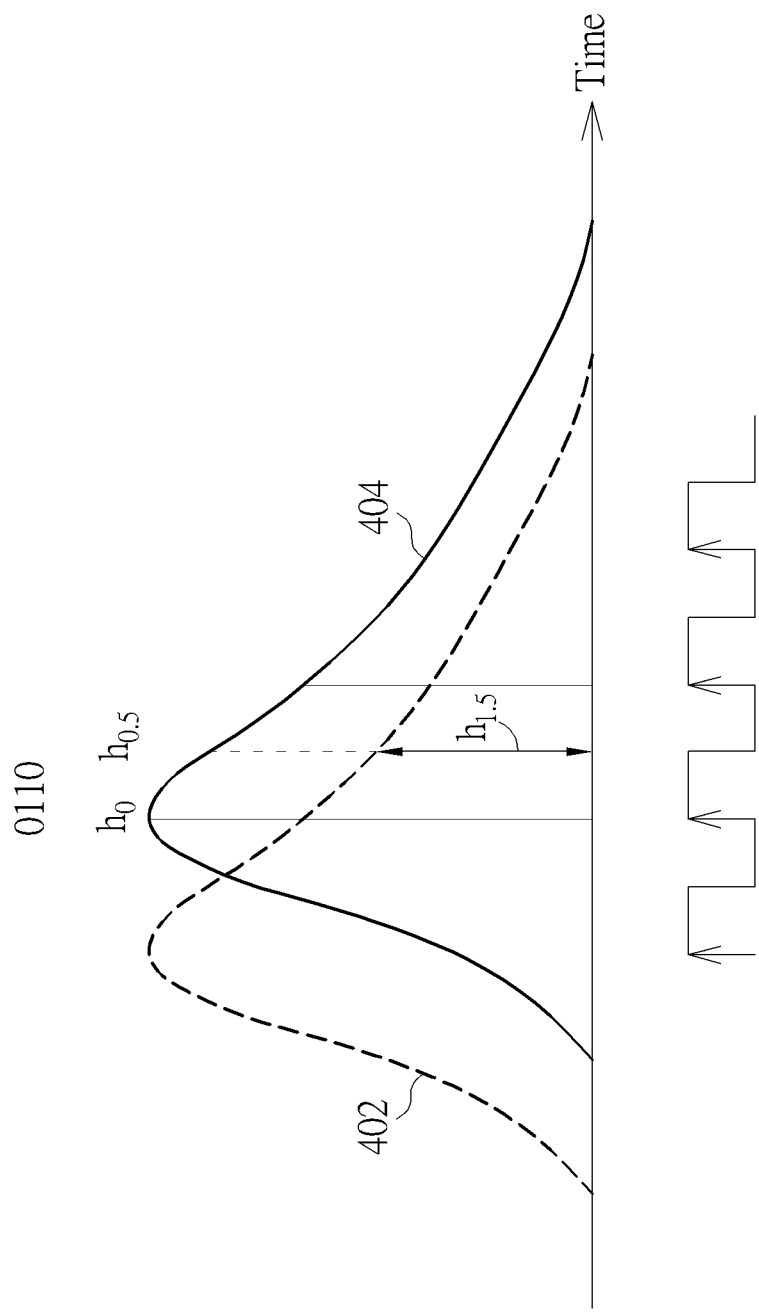
FIG. 4 is a diagram illustrating waveforms resulting from transmitting a pattern "0110" over the channel with the pulse response shown in FIG. 2.
Figure 5:
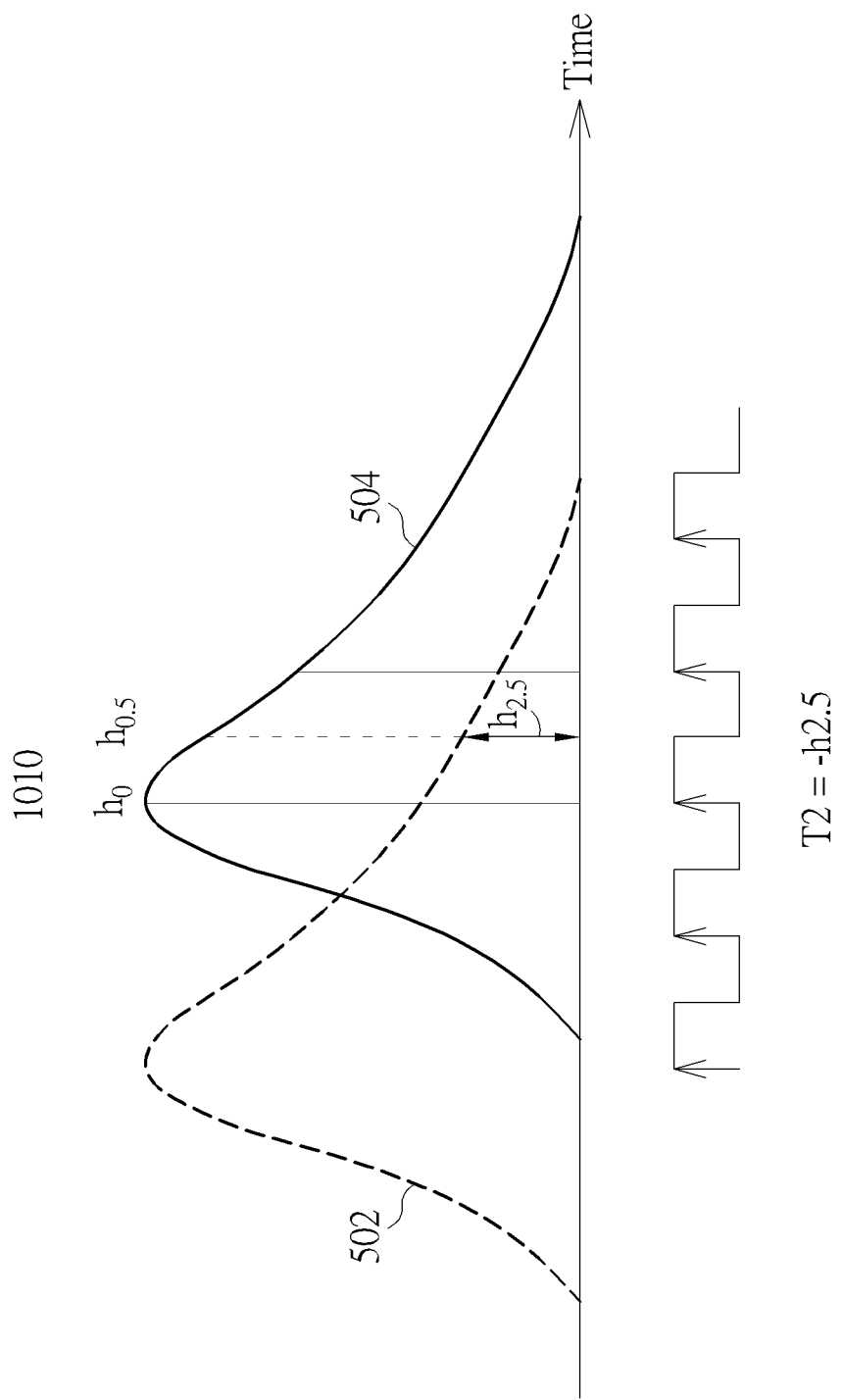
FIG. 5 is a diagram illustrating waveforms resulting from transmitting a pattern "1010" over the channel with the pulse response shown in FIG. 2.

FIG. 2 is a diagram illustrating a pulse response of a channel according to an embodiment of the present invention. The voltage at the time instant $T_0$ is represented by $h_0$. The time instant $T_0$ may be regarded as the start time of transmitting/receiving one data bit "0" or "1" to/from the channel. The voltage at the time instant $T_{0.5}$ is represented by $h_{0.5}$, where $T_{0.5}=T_0+0.5UI$ (unit interval). In the data communication system, one UI is a bit period of one data bit. The voltage at the time instant $T_{1.5}$ is represented by $h_{1.5}$, where $T_{1.5}=T_0+1.5UI$. The voltage at the time instant $T_{2.5}$ is represented by $h_{2.5}$, where $T_{2.5}=T_0+2.5UI$. In general, the data sampling position (or data sampling time) is at $T_n$, and the data transition position is at $T_{n+0.5}$, where n is a positive integer. FIG. 3 is a diagram illustrating a waveform resulting from transmitting a pattern "0010" over the channel with the pulse response shown in FIG. 2. Preferably, the transmitted data is sampled at the data center location. Hence, the waveform 302 is sampled at time instant $T_0$, where the voltage $h_0$ at the time instant $T_0$ has the maximum level. In other words, the voltage $h_0$ shown in FIG. 3 is sampled for following bit decision at a slicer. FIG. 4 is a diagram illustrating waveforms resulting from transmitting a pattern "0110" over the channel with the pulse response shown in FIG. 2. The waveform 404 of the later data bit "1" is sampled at time instant $T_0$, where the voltage $h_0$ at the time instant $T_0$ has the maximum level. In other words, the voltage $h_0$ shown in FIG. 4 is sampled for following bit decision at a slicer. Regarding the waveform 404 of the later data bit "1", the time instant $T_{0.5}$ corresponds to the data transition position. However, when the former data bit "1" is transmitted over the channel, the resulting waveform 402 causes a post-cursor (i.e., voltage $h_{1.5}$) at the data transition position $T_{0.5}$, which affects the eye width. FIG. 5 is a diagram illustrating waveforms resulting from transmitting a pattern "1010" over the channel with the pulse response shown in FIG. 2. The waveform 504 of the later data bit "1" is sampled at time instant $T_0$, where the voltage $h_0$ at the time instant $T_0$ has the maximum level. In other words, the voltage $h_0$ shown in FIG. 5 is sampled for following bit decision at a slicer. Regarding the waveform 504 of the later data bit "1", the time instant $T_{0.5}$ corresponds to the data transition position. However, when the former data bit "1" is transmitted over the channel, the resulting waveform 502 causes a post-cursor (i.e., voltage $h_{2.5}$) at the data transition position $T_{0.5}$, which affects the eye width. Eye performance (particularly, eye width of the eye diagram) is degraded by the residual post-cursor ISI ($h_{1.5}$ & $h_{2.5}$). The clock-less DFE 100 is capable of removing the post-cursor ISI ($h_{1.5}$ & $h_{2.5}$) to optimize the eye performance (particularly, eye width of the eye diagram). For example, the tap coefficient T1 may be set by $-h_{1.5}$, and the tap coefficient T2 may be set by $-h_{2.5}$. In addition, as shown in FIG. 1, the delay amount dT1 is configured by a delay code C1 assigned to the DCDL 108, and the delay amount dT2 is configured by a delay code C2 assigned to the DCDL 110. Hence, the delay codes C1 and C2 may be properly set to make one delay amount TD=dT1 applied to the output signal $D_{OUT}$ be equal to 1.5UI and make another delay amount TD=dT1+dT2=1.5UI+1UI applied to the output signal $D_{OUT}$ be equal to 2.5UI.

Alternatively, eye performance (particularly, eye height of the eye diagram) is degraded by the residual post-cursor ISI ($h_1$ & $h_2$). The clock-less DFE 100 is capable of removing the post-cursor ISI ($h_1$ & $h_2$) to optimize the eye performance (particularly, eye height of the eye diagram). For example, the tap coefficient T1 may be set by $-h_1$, and the tap coefficient T2 may be set by $-h_2$. In addition, as shown in FIG. 1, the delay amount dT1 is configured by a delay code C1 assigned to the DCDL 108, and the delay amount dT2 is configured by a delay code C2 assigned to the DCDL 110. Hence, the delay codes C1 and C2 may be properly set to make one delay amount TD=dT1 applied to the output signal $D_{OUT}$ be equal to 1UI and make another delay amount TD=dT1+dT2=1UI+1UI applied to the output signal $D_{OUT}$ be equal to 2UI. This alternative DFE design also falls within the scope of the present invention.

Figure 6:
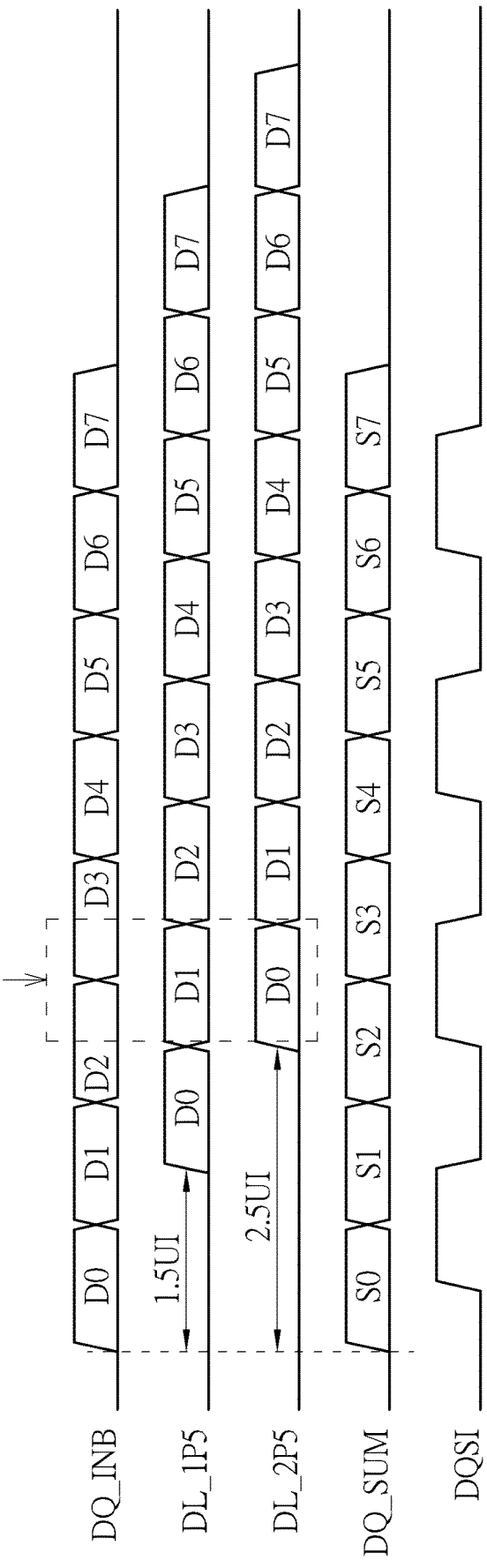
FIG. 6 is a timing diagram of different signals in the clock-less DFE 100 shown in FIG. 1.

FIG. 6 is a timing diagram of different signals in the clock-less DFE 100 shown in FIG. 1. Suppose that dT1 is set by 1.5UI, and dT2 is set by 1UI. The multiplexer output signal DL_1P5 may be regarded as a delay signal generated from applying 1.5UI delay to the input signal DQ_INB. The multiplexer output signal DL_2P5 may be regarded as a delay signal generated from applying 2.5UI delay to the input signal DQ_INB. The feedback signal FB_1 is generated by applying the tap coefficient T1 (e.g., $-h_{1.5}$) to the multiplexer output signal DL_1P5. The feedback signal FB_2 is generated by applying the tap coefficient T2 (e.g., $-h_{2.5}$) to the multiplexer output signal DL_2P5. The equalized signal DQ_SUM is generated by adding the feedback signals FB_1 and FB_2 to the input signal DQ_INB, and may be expressed using the following equation.

$$DQ\_SUM = DQ\_INB + FB_1 + FB_2 = DQ\_INB + T1 \times DL\_1P5 + T2 \times DL\_2P5 \quad (1)$$

Figure 7:
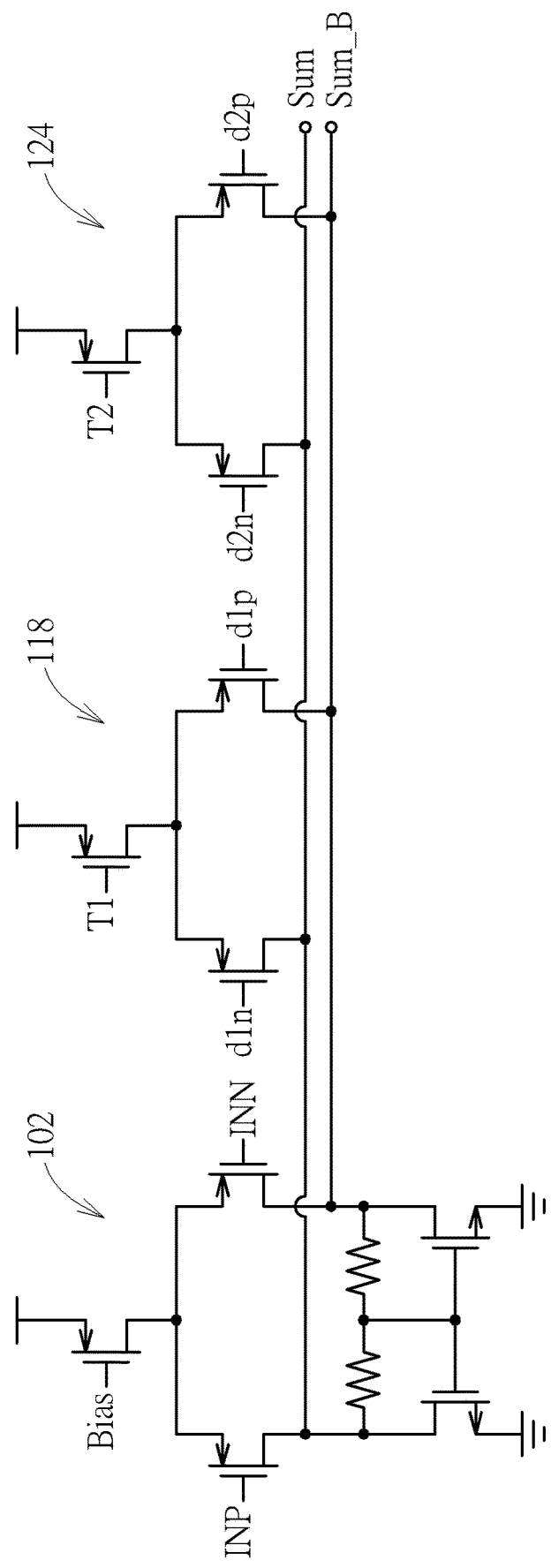
FIG. 7 is a circuit diagram illustrating a differential circuit design for combining an input signal and two feedback signals according to an embodiment of the present invention.

In a case where the input signal DQ_INB is a differential signal, the feedback signals FB_1 and FB_2 and the equalized signal DQ_SUM are differential signals. The above equation (1) can be realized by using a circuit design shown in FIG. 7, where the input signal DQ_INB is a differential signal consisting of a positive signal INP and a negative signal INN, the feedback FB_1 is a differential signal consisting of a positive signal d1p and a negative signal d1n, the feedback signal FB_2 is a differential signal consisting of a positive signal d2p and a negative signal d2n, and the equalized signal DQ_SUM is a differential signal consisting of a positive signal Sum and a negative signal Sum B.

The post-cursors in the equalized signal DQ_SUM that are caused by previous data bits "1" can be removed with the help of the feedback signals FB_1 and FB_2. The output signal $D_{OUT}$ of the clock-less DFE 100 is derived from the equalized signal DQ_SUM. When the output signal $D_{OUT}$ of the clock-less DFE 100 is later sampled by at least one decision circuit (e.g., slicer) according to rising edges and falling edges of a timing signal DQSI, correct data bits can be obtained due to the fact that the post-cursor ISI is eliminated.

As mentioned above, the delay code C1 decides the delay amount dT1 of the DCDL 108, and the delay code C2 decides the delay amount dT2 of the DCDL 110. In one exemplary design, a delay line step size of the DCDLs 108 and 110 may be measured by a measurement circuit (not shown) in a receiver of a data communication system (e.g., DDR memory system). For example, the delay line step size may be measured in the unit of UI, such as k*UI. The delay code C1 can be obtained from a look-up table according to a plurality of parameters such as the date rate (which decides the size of one UI) and the delay line step size (which decides a delay amount increment/decrement for a unit change of the delay code), where the look-up table may be established based on simulation. The delay code C2 may be obtained based on the UI and the delay line step size (e.g., $\frac{1UI}{\text{delay line step size}}$).

It should be noted that, since the feedback loop may include other component(s) with intrinsic delay(s), the delay amount dT1 offered by the DCDL 108 is not necessarily to be 1.5UI. Based on experiment results, the eye width can still be improved under the condition that the delay amount dT1 is close to the ideal value (i.e., 1.5UI) within a tolerance range from +0.25UI to −0.25UI under the data rate of 8.533 Gbps.

In the embodiment shown in FIG. 1, the clock-less DFE 100 employs n-tap (n≥2) DFE architecture such as 2-tap DFE architecture. However, this is for illustrative purposes only, and is not meant to be a limitation of the present invention. In practice, the proposed clock-less DFE can also be applied to 1-tap DFE architecture.

Figure 8:
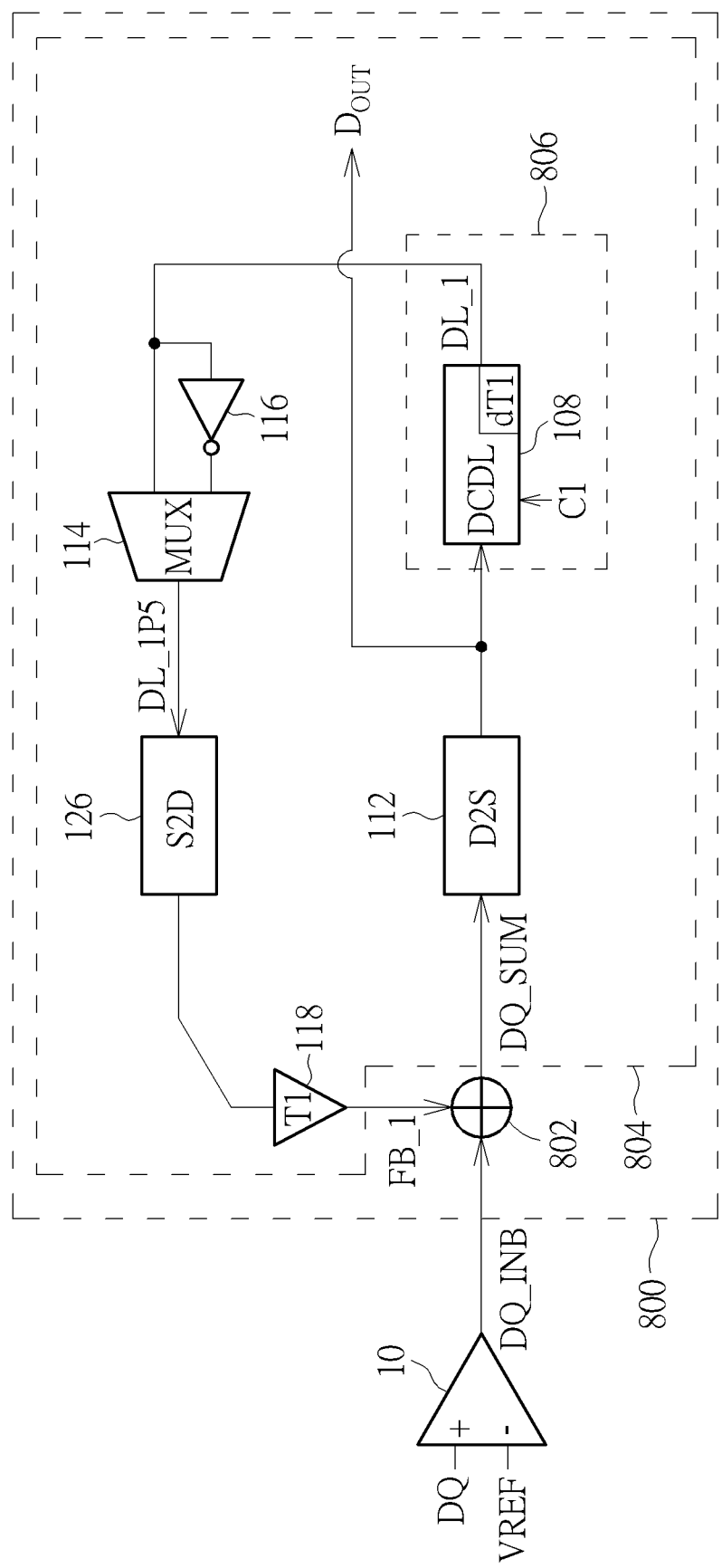
FIG. 8 is a diagram illustrating a second clock-less decision-feedback equalizer according to an embodiment of the present invention.

FIG. 8 is a diagram illustrating a second clock-less DFE according to an embodiment of the present invention. The clock-less DFE 800 may be a part of a receiver in a data communication system. For example, the data communication system may be any source-synchronous system such as a DDR memory system. The clock-less DFE 800 is arranged to equalize the input signal DQ_INB received from a preceding stage (e.g., receiver analog front-end circuit 10) to generate and output an output signal $D_{OUT}$ to a following stage (e.g., one or more slicers, not shown in FIG. 8). The clock-less DFE 800 includes a combining circuit 802 and a feedback filter 804. In this embodiment, the clock-less DFE 800 employs 1-tap DFE architecture. Hence, the combining circuit 802 acts as a summer, and is arranged to combine input signal DQ_INB and single feedback signal FB_1 to generate the equalized signal DQ_SUM. The feedback filter 804 is arranged to generate the feedback signal FB_1 according to the equalized signal DQ_SUM. Hence, a controllable delay circuit 806 included in the feedback filter 804 includes only one DCDL 108. Specifically, the feedback filter 804 is obtained by omitting the DCDL 110, the inverter 122, the multiplexer 120, the single-ended to differential converter 128, and the multiplier 124 shown in FIG. 1. In a case where the input signal DQ_INB is a differential signal, the feedback filter 804 includes the differential to single-ended converter (labeled by "D2S") 112 for converting the equalized signal DQ_SUM into a single-ended signal that acts as the output signal $D_{OUT}$, and further includes the single-ended to differential converter (labeled by "S2D") 126 for converting the multiplexer output signal DL_1P5 into a differential form. In another case where the input signal DQ_INB is a single-ended signal, the feedback filter 804 may be modified to omit the differential to single-ended converter 112 and the single-ended to differential converter 126. As a person skilled in the art can readily understand details of the clock-less DFE 800 with 1-tap DFE architecture after reading above paragraphs directed to the clock-less DFE 100 with n-tap DFE architecture, further description is omitted here for brevity.

Figure 9:
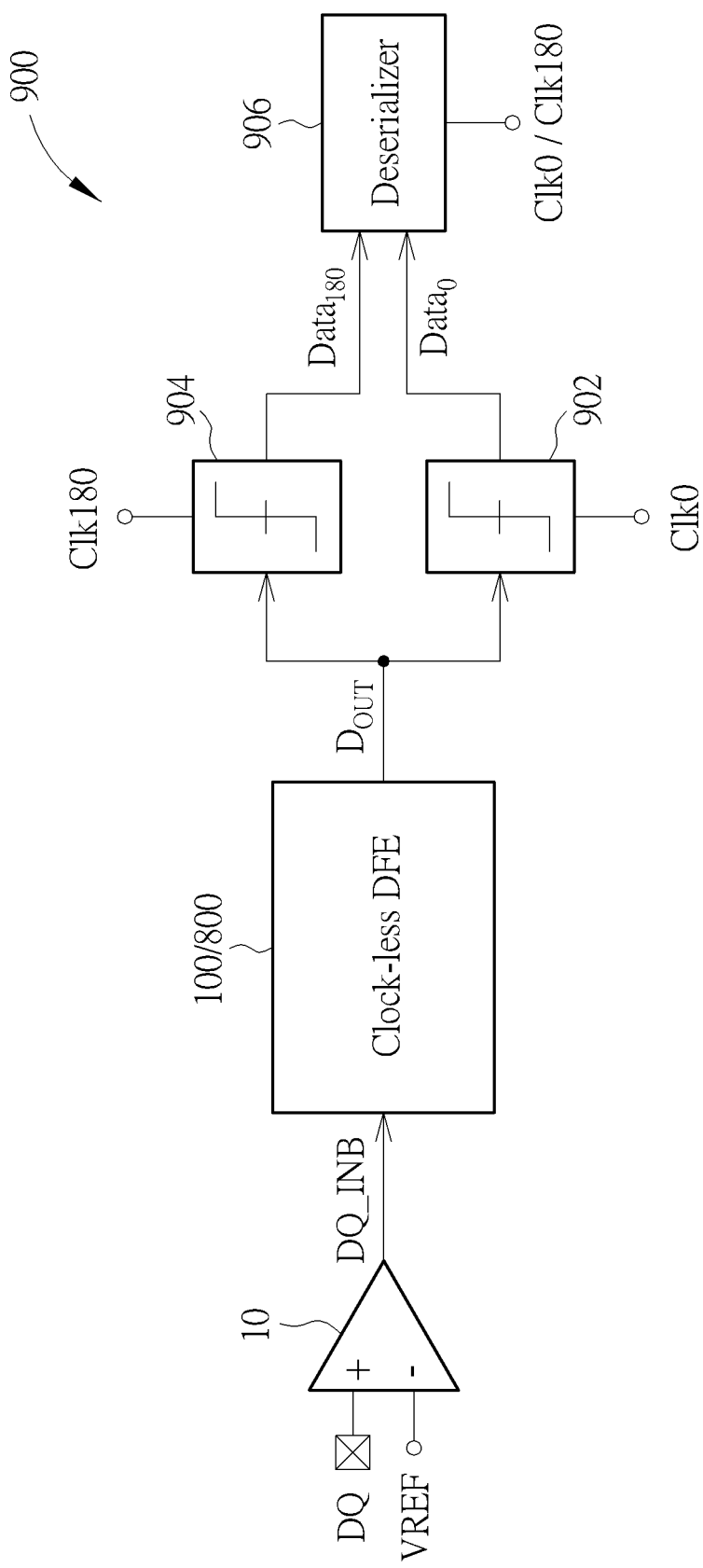
FIG. 9 is a diagram illustrating a half-rate receiver using the proposed clock-less decision-feedback equalizer according to an embodiment of the present invention.
Figure 10:
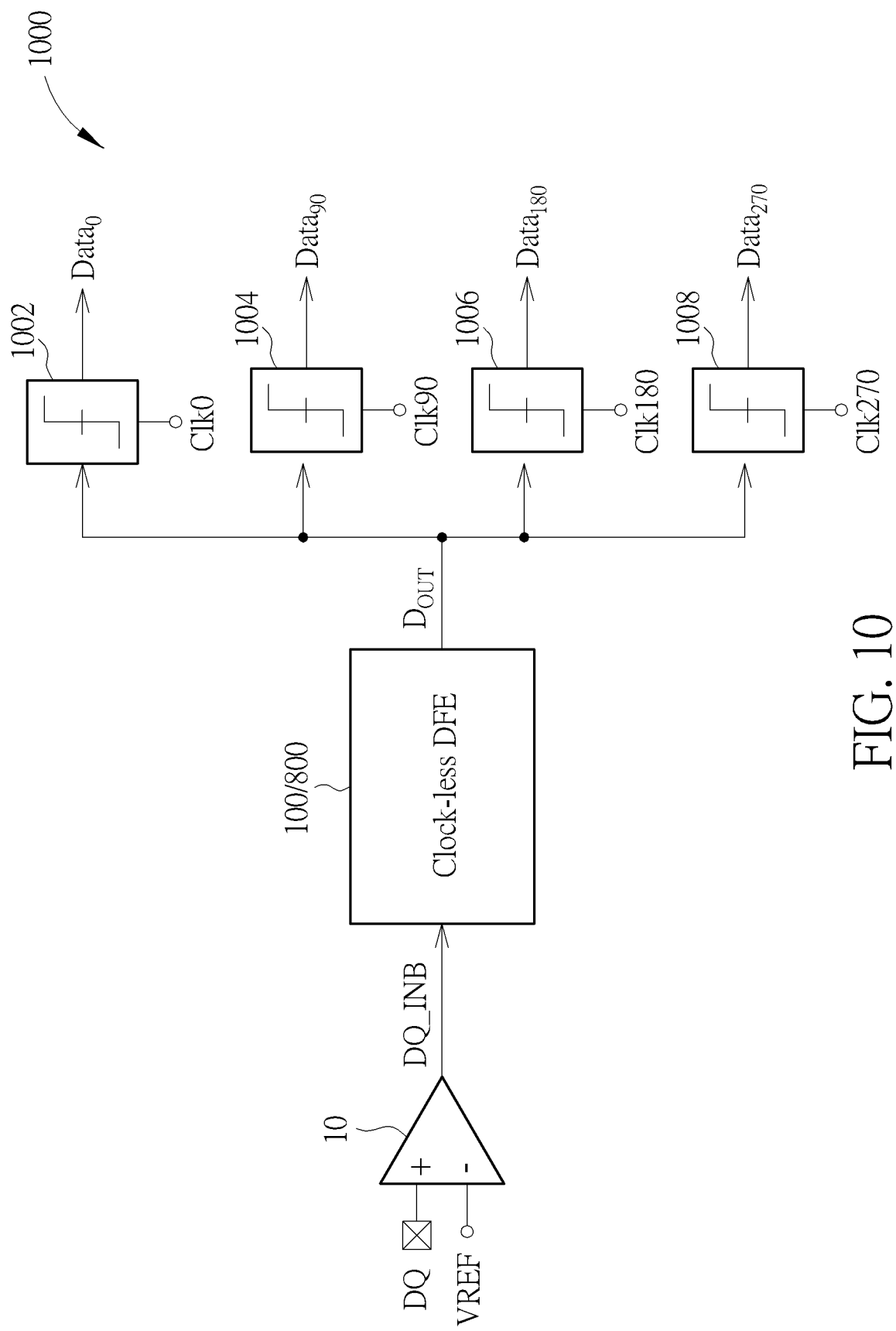
FIG. 10 is a diagram illustrating a quarter-rate receiver using the proposed clock-less decision-feedback equalizer according to an embodiment of the present invention.

The proposed clock-less DFE 100/800 may be a part of a receiver in a data communication system. For example, the receiver may employ full-rate architecture. However, this is for illustrative purposes only, and is not meant to be a limitation of the present invention. FIG. 9 is a diagram illustrating a half-rate receiver using the proposed clock-less DFE 100/800 according to an embodiment of the present invention. In addition to the proposed clock-less DFE 100/800, the half-rate receiver 900 includes two slicers 902 and 904 that operate according to two clock signals Clk0 and Clk180 having the same frequency but different phases 0° and 180°. Decision outputs $Data_0$ and $Data_{180}$ of the slicers 902 and 904 undergo parallel-to-serial conversion at the deserializer 906. FIG. 10 is a diagram illustrating a quarter-rate receiver using the proposed clock-less DFE 100/800 according to an embodiment of the present invention. In addition to the proposed clock-less DFE 100/800, the quarter-rate receiver 1000 includes four slicers 1002, 1004, 1006, 1008 that operate according to four clock signals Clk0, Clk90, Clk180, and Clk270 having the same frequency but different phases 00, 90°, 180°, and 270°. Decision outputs $Data_0$, $Data_{90}$, $Data_{180}$, and $Data_{270}$ of the slicers 1002, 1004, 1006, and 1008 will undergo parallel-to-serial conversion at a deserializer (not shown). To put it simply, any receiver architecture using the proposed clock-less DFE 100/800 for post-cursor ISI cancellation falls within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A decision-feedback equalizer (DFE) comprising:
   a combining circuit, arranged to combine an input signal and at least one feedback signal to generate an equalized signal; and
   a feedback filter, arranged to generate the at least one feedback signal according to the equalized signal, wherein the feedback filter comprises:
      a controllable delay circuit, arranged to receive an output signal that is derived from the equalized signal without via a decision circuit, and apply at least one delay amount to generate at least one delay signal, wherein the at least one feedback signal is derived from the at least one delay signal;
      at least one multiplier;
      at least one multiplexer; and
      at least one inverter, wherein the at least one delay signal is fed back to the combining circuit through the at least one multiplexer and the at least one multiplier, or is fed back to the combining circuit through the at least one inverter, the at least one multiplexer and the at least one multiplier;
   wherein the at least one feedback signal comprises a single feedback signal only, the at least one delay signal comprises a single delay signal only, and the at least one delay amount comprises a single delay amount only.

2. The DFE of claim 1, wherein the controllable delay circuit comprises:
   a single digitally controlled delay line, arranged to apply the single delay amount to the output signal, for generating the single delay signal from which the single feedback signal is derived.

3. The DFE of claim 2, wherein the single delay amount is configured by a delay code assigned to the single digitally controlled delay line, and the delay code is obtained from a look-up table.

4. A decision-feedback equalizer (DFE) comprising:
   a combining circuit, arranged to combine an input signal and at least one feedback signal to generate an equalized signal; and
   a feedback filter, arranged to generate the at least one feedback signal according to the equalized signal, wherein the feedback filter comprises:
      a controllable delay circuit, arranged to receive an output signal that is derived from the equalized signal without via a decision circuit, and apply at least one delay amount to generate at least one delay signal, wherein the at least one feedback signal is derived from the at least one delay signal;
      at least one multiplier;
      at least one multiplexer; and
      at least one inverter, wherein the at least one delay signal is fed back to the combining circuit through the at least one multiplexer and the at least one multiplier, or is fed back to the combining circuit through the at least one inverter, the at least one multiplexer and the at least one multiplier;

wherein the at least one feedback signal comprises a plurality of feedback signals, the at least one delay signal comprises a plurality of delay signals, the at least one delay amount comprises a plurality of delay amounts, and the controllable delay circuit comprises:

a plurality of digitally controlled delay lines, wherein the plurality of digitally controlled delay lines are connected in series, and comprise:

a first digitally controlled delay line, arranged to apply a first delay amount to the output signal, for generating a first delay signal from which a first feedback signal is derived; and a second digitally controlled delay line, arranged to apply a second delay amount to the first delay signal, for generating a second delay signal from which a second feedback signal is derived;

wherein the first delay amount is configured by a first delay code assigned to the first digitally controlled delay line, and the first delay code is obtained from a look-up table; or the second delay amount is configured by a second delay code assigned to the second digitally controlled delay line, and the second delay code is obtained based on a unit interval (UI) and a delay line step size.

5. A decision-feedback equalizer (DFE) comprising:

a combining circuit, arranged to combine an input signal and at least one feedback signal to generate an equalized signal; and a feedback filter, arranged to generate the at least one feedback signal according to the equalized signal, wherein the feedback filter comprises:

a controllable delay circuit, arranged to receive an output signal that is derived from the equalized signal without via a decision circuit, and apply at least one delay amount to generate at least one delay signal, wherein the at least one feedback signal is derived from the at least one delay signal;

at least one multiplier;

at least one multiplexer; and at least one inverter, wherein the at least one delay signal is fed back to the combining circuit through the at least one multiplexer and the at least one multiplier, or is fed back to the combining circuit through the at least one inverter, the at least one multiplexer and the at least one multiplier;

wherein the input signal is derived from a data signal of a source-synchronous system.

6. The DFE of claim 5, wherein the source-synchronous system is a double data rate (DDR) memory system.

7. A decision-feedback equalization method comprising:

combining an input signal and at least one feedback signal to generate an equalized signal; and generating the at least one feedback signal according to the equalized signal, comprising:

in response to receiving an output signal that is derived from the equalized signal without via a decision circuit, applying, by a controllable delay circuit, at least one delay amount to generate at least one delay signal, wherein the at least one feedback signal is derived from the at least one delay signal; and generating the at least one feedback signal by feeding back the at least one delay signal through at least one multiplexer and at least one multiplier, or by feeding back the at least one delay signal through at least one inverter, the at least one multiplexer and the at least one multiplier;

wherein the at least one feedback signal comprises a single feedback signal only, the at least one delay signal comprises a single delay signal only, and the at least one delay amount comprises a single delay amount only.

8. The decision-feedback equalization method of claim 7, wherein the controllable delay circuit comprises a single digitally controlled delay line; and applying the at least one delay amount to generate the at least one delay signal comprises:

applying, by the single digitally controlled delay line, the single delay amount to the output signal, for generating the single delay signal from which the single feedback signal is derived.

9. The decision-feedback equalization method of claim 8, wherein the single delay amount is configured by a delay code assigned to the single digitally controlled delay line, and the delay code is obtained from a look-up table.

10. A decision-feedback equalization method comprising:

combining an input signal and at least one feedback signal to generate an equalized signal; and generating the at least one feedback signal according to the equalized signal, comprising:

in response to receiving an output signal that is derived from the equalized signal without via a decision circuit, applying, by a controllable delay circuit, at least one delay amount to generate at least one delay signal, wherein the at least one feedback signal is derived from the at least one delay signal; and generating the at least one feedback signal by feeding back the at least one delay signal through at least one multiplexer and at least one multiplier, or by feeding back the at least one delay signal through at least one inverter, the at least one multiplexer and the at least one multiplier;

wherein the at least one feedback signal comprises a plurality of feedback signals, the at least one delay signal comprises a plurality of delay signals, the at least one delay amount comprises a plurality of delay amounts, the controllable delay circuit comprises a plurality of digitally controlled delay lines that are connected in series and comprise a first digitally controlled delay line and a second digitally controlled delay line, and applying the at least one delay amount to generate the at least one delay signal comprises:

applying, by the first digitally controlled delay line, a first delay amount to the output signal, for generating a first delay signal from which a first feedback signal is derived; and applying, by the second digitally controlled delay line, a second delay amount to the first delay signal, for generating a second delay signal from which a second feedback signal is derived;

wherein the first delay amount is configured by a first delay code assigned to the first digitally controlled delay line, and the first delay code is obtained from a look-up table; or the second delay amount is configured by a second delay code assigned to the second digitally controlled delay line, and the second delay code is obtained based on a unit interval (UI) and a delay line step size.

11. A decision-feedback equalization method comprising:

combining an input signal and at least one feedback signal to generate an equalized signal; and generating the at least one feedback signal according to the equalized signal, comprising:
- in response to receiving an output signal that is derived from the equalized signal without via a decision circuit, applying, by a controllable delay circuit, at least one delay amount to generate at least one delay signal, wherein the at least one feedback signal is derived from the at least one delay signal; and
- generating the at least one feedback signal by feeding back the at least one delay signal through at least one multiplexer and at least one multiplier, or by feeding back the at least one delay signal through at least one inverter, the at least one multiplexer and the at least one multiplier;

wherein the input signal is derived from a data signal of a source-synchronous system.

12. The decision-feedback equalization method of claim 11, wherein the source-synchronous system is a double data rate (DDR) memory system.

* * * * *